(12) United States Patent
Sawada et al.

(10) Patent No.: US 6,372,152 B1
(45) Date of Patent: Apr. 16, 2002

(54) PIEZOELECTRIC CERAMIC COMPOSITION AND CERAMIC PIEZOELECTRIC DEVICE EMPLOYING THE COMPOSITION

(75) Inventors: Takuya Sawada, Moriyama; Masahiko Kimura, Kusatsu; Akira Ando, Omihachiman; Koichi Hayashi, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 5 days.

(21) Appl. No.: 09/643,785

(22) Filed: Aug. 22, 2000

(30) Foreign Application Priority Data

Aug. 26, 1999 (JP) .............................. 11-240146
May 31, 2000 (JP) ........................ 2000-161832

(51) Int. Cl.[7] .......................... H01B 3/12; H01G 4/12; H01L 41/00; H03H 9/00
(52) U.S. Cl. ................. 252/62.9 R; 501/136; 501/134; 310/358
(58) Field of Search ............... 252/62.9 R; 501/136, 501/134; 310/358

(56) References Cited

U.S. PATENT DOCUMENTS 6,248,254 B1 * 6/2001 Kimura et al. .......... 252/62.9 R

* cited by examiner

Primary Examiner—C. Melissa Koslow
(74) Attorney, Agent, or Firm—Ostrolenk, Faber, Gerb & Soffen, LLP

(57) ABSTRACT

To provide a piezoelectric ceramic composition predominantly comprising $CaBi_4Ti_4O_{15}$, which composition can be fired at 1100° C. or lower, which exhibits an electromechanical coupling coefficient (kt) of a sufficient level for practical use, and which serves as a useful material for producing ceramic piezoelectric devices such as piezoelectric filters, piezoelectric oscillators and piezoelectric transducers, and to provide a ceramic piezoelectric device employing the composition, the piezoelectric ceramic composition comprises a component represented by the formula $CaBi_4Ti_4O_{15}$, wherein the composition contains W in an amount of about 0.5 mol or less per mol of Bi.

20 Claims, 1 Drawing Sheet

PIEZOELECTRIC CERAMIC COMPOSITION AND CERAMIC PIEZOELECTRIC DEVICE EMPLOYING THE COMPOSITION

BACKGROUND OF THE INVENTION

1. Field of the Invention

The present invention relates to a piezoelectric ceramic composition and a ceramic piezoelectric device. More particularly, the invention relates to a piezoelectric ceramic composition serving as a useful material for producing ceramic piezoelectric devices such as piezoelectric filters, piezoelectric oscillators, and piezoelectric transducers, and a ceramic piezoelectric device employing the ceramic composition.

2. Background Art

Conventionally, piezoelectric ceramic compositions containing lead titanate zirconate ($Pb(Ti_xZr_{1-x})O_3$) or lead titanate ($PbTiO_3$) as a primary component have been widely used for producing piezoelectric devices such as piezoelectric filters, piezoelectric oscillators, and piezoelectric transducers. However, since such piezoelectric ceramic compositions contain a large amount of lead, lead oxide is evaporated during the production processes of the mentioned products, posing a problem that product quality varies from product to product. In order to solve this problem, the dielectric ceramic compositions preferably contain a small amount of lead, and more preferably no lead.

In contrast, piezoelectric ceramic compositions predominantly containing a bismuth layered compound such as $CaBi_4Ti_4O_{15}$ suffer no such drawbacks due to the absence of lead oxide in the composition.

However, piezoelectric ceramic compositions predominantly containing a bismuth layered compound such as $CaBi_4Ti_4O_{15}$ must be fired at a temperature as high as 1150° C. or more so as to obtain piezoelectric ceramic material exhibiting an electromechanical coupling coefficient (kt) of 10% or higher, which is needed for practical use. Firing at such high temperatures requires a high-performance firing furnace of high cost. In addition, when a ceramic piezoelectric device such as a piezoelectric filter having internal electrodes is produced, the electrode material must have a melting point temperature higher than the firing temperature of the material per se. Thus, expensive electrode material such as platinum or palladium must be used, thereby increasing production costs.

In view of the foregoing, an object of the present invention is to provide a piezoelectric ceramic composition predominantly comprising $CaBi_4Ti_4O_{15}$ which composition can be fired at 1100° C. or lower, which exhibits an electromechanical coupling coefficient (kt) sufficient for practical use, and which serves as a useful material for producing ceramic piezoelectric devices such as piezoelectric filters, piezoelectric oscillators and piezoelectric transducers. Another object of the present invention is to provide a ceramic piezoelectric device employing the ceramic composition.

SUMMARY OF THE INVENTION

Accordingly, the present invention provides a piezoelectric ceramic composition comprising a primary component represented by the formula $CaBi_4Ti_4O_{15}$, wherein the composition contains W in an amount of about 0.5 mol or less (but greater than 0) per mol of Bi contained in the primary component. Preferably, the composition contains a primary component represented by $CaBi_4(Ti_{1-y}W_y)_4O_{15}$ (where $0<y\leq0.5$).

Preferably, the piezoelectric ceramic composition contains a divalent metal element other than Ca in an amount of about 0.125 mol or less (but greater than 0 mol) per mol of Bi. The divalent metal element may be at least one Mg, Sr and Ba.

Preferably, the piezoelectric ceramic composition contains a trivalent metal element other than Bi in an amount of about 0.075 mol or less (but greater than 0 mol) per mol of Bi. The trivalent metal element may be at least one of La, Ce, Pr, Nd, Sm, Gd, Dy, Er, Yb, Sc and Y.

Furthermore, the piezoelectric ceramic composition preferably contains Mn in an amount of about 1.5 wt. % or less (but greater than 0) calculated as $MnCO_3$.

In the present invention, there is also provided a piezoelectric ceramic material comprising a piezoelectric ceramic composition as recited above and a ceramic piezoelectric device containing electrodes attached to the ceramic material.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
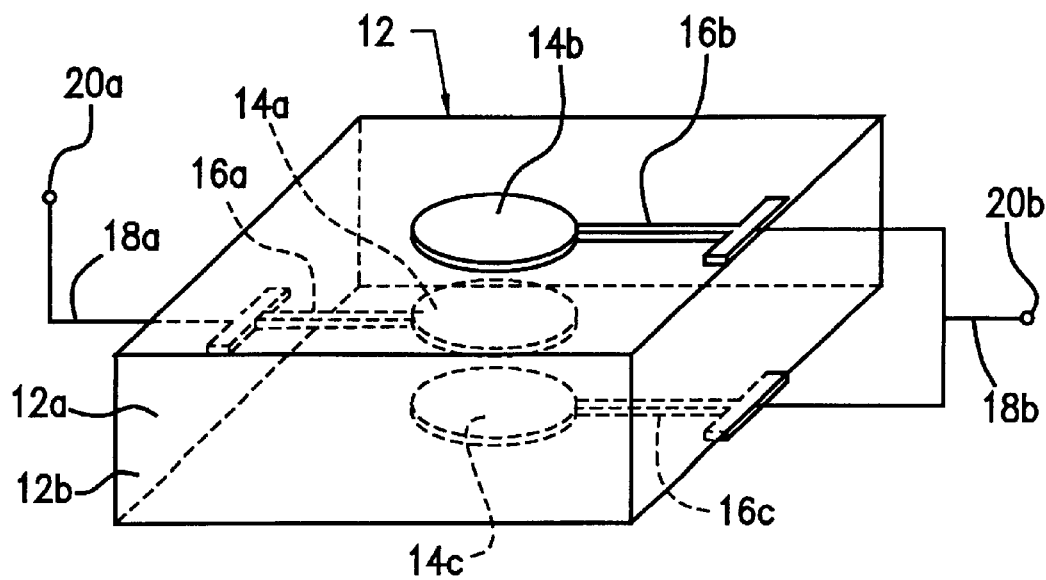
FIG. 1 is a perspective view of one example of the ceramic piezoelectric transducer according to the present invention.

The piezoelectric ceramic composition of the present invention contains W in an amount of about 0.5 mol or less (but greater than 0) based on the 1 mol of Bi. When the amount is in excess of about 0.5 mol, the electromechanical coupling coefficient (kt) decreases to a level that is insufficient for practical use.

In addition, the piezoelectric ceramic composition of the present invention may contain, in the primary component, a divalent metal element such as Mg, Sr or Ba or a trivalent metal element such as La, Ce, Pr, Nd, Sm, Gd, Dy, Er, Yb, Sc and Y. Particularly, when the piezoelectric ceramic composition contains at least one of La, Ce, Pr, Nd, Sm, Gd, Dy, Er, Yb, Sc and Y in an amount of about 0.075 mol or less (but greater than 0 mol) per mol of Bi, the temperature coefficient of resonance frequency (abbreviated as frTC) is in the range of −20° C. to 80° C., is decreased, although the precise reason for this has not been elucidated. Thus, the piezoelectric ceramic composition can be fired at 1100° C. or lower, has an electromechanical coupling coefficient of a level which is sufficient for practical use and is a useful material for producing ceramic piezoelectric devices such as piezoelectric transducers. At least one of La, Ce, Pr, Nd, Sm, Gd, Dy, Er, Yb, Sc and Y is incorporated into the piezoelectric ceramic composition of the present invention in an amount of about 0.075 mol or less (but greater than 0 mol) per mol of Bi. When the amount is in excess of about 0.75 mol, the electromechanical coupling coefficient (kt) decreases as compared with that of a similar composition containing no such additional trivalent metal element. Thus, satisfactory effects cannot be attained by excessive addition of the above metal elements.

The frTC is defined as follows:

$$\text{frTC} = (\text{fr(max)} - \text{fr(min)}) / (\text{fr}(20°\text{ C.}) \cdot 100)$$

wherein, fr(max) represents the maximum resonance frequency in the temperature range from −20° C. to 80° C.;

fr(min) represents the minimum resonance frequency in the temperature range from −20° C. to 80° C.; and fr(20° C.) represents the resonance frequency at 20° C.

In Japanese Patent Application No. 11-030322, we have already clarified that electromechanical coupling coefficient of a piezoelectric ceramic composition predominantly containing $CaBi_4Ti_4O_{15}$ is enhanced by addition of Mn in an amount of about 1.5 wt. % or more as $MnCO_3$. In the present invention, the addition of Mn is also effective. Thus, the present invention provides a piezoelectric ceramic composition which can be fired at 1100° C. or lower, exhibits an electromechanical coupling coefficient (kt) sufficient for practical use and is useful for producing a piezoelectric ceramic material.

EXAMPLE $CaCO_3$, $Bi_2O_3$, $TiO_2$, $MgCO_3$, $SrCO_3$, $BaCO_3$, $La_2O_3$, $Nd_2O_3$, $Sm_2O_3$, $Y_2O_3$, $WO_6$ and $MnCO_3$ were used as starting materials. They were weighed and wet-mixed for approximately four hours by means of a ball mill so as to prepare mixtures having a composition of $(Ca_{1-x}M_x)Bi_4(Ti_{1-y}W_y)_4O_{15}$+z wt. % of $MnCO_3$ (M=Mg, Sr, Ba, La, Nd, Sm or Y; $0 \leq y \leq 0.6$; $0 \leq z \leq 1.6$; when M=Mg, Sr or Ba, $0 \leq x \leq 0.6$; and when M=La, Nd, Sm or Y, $0 \leq x \leq 0.4$. Each mixture was dried and calcined at 700–900° C. The calcined product was roughly crushed and then further crushed together with an appropriate amount of an organic binder under wet conditions for four hours by means of a ball mill. The thus-crushed product was then passed through a 40-mesh sieve, thereby regulating the particle size. The resultant powder was pressed at 1000 kg/cm² to form a disk having a diameter of 12.5 mm and a thickness of 1 mnm, and the disk was fired in air at 100–1150° C., thereby forming a ceramic material in the shape of a disk. A silver paste was applied to each main surface of the ceramic disk and burnt in a routine manner, thereby forming silver electrodes. Subsequently, the ceramic disk was immersed in insulating oil at 150–200° C. and polarized by application of DC voltage of 5–10 kg/mm for 10–30 minutes, to thereby obtain a piezoelectric ceramic material (test sample).

The density, temperature coefficient of resonance frequency (frTC), and electromechanical coupling constant of the samples obtained were measured. The results are shown in Tables 1 to 3, together with firing temperature and metal elements (M) and parameters x, y, and z in the above compositional formula. Samples marked with "*" fall outside the compositional proportions present invention.

TABLE 1

| Sample No. | M | x | y | z | Firing temperature (° C.) | Density (g/cm²) | frTC (ppm/° C.) | kt (%) |
|---|---|---|---|---|---|---|---|---|
| 1* | — | 0 | 0 | 0 | 1150 | 6.99 | 40.5 | 10.0 |
| 2* | — | 0 | 0 | 0 | 1150 | 5.88 | Not measurable | Not polarized |
| 3 | — | 0 | 0.1 | 0 | 1100 | 6.92 | 39.5 | 13.1 |
| 4 | — | 0 | 0.3 | 0 | 1100 | 6.92 | 39.1 | 13.2 |
| 5 | — | 0 | 0.5 | 0 | 1100 | 6.87 | 39.8 | 13.8 |
| 6* | — | 0 | 0.6 | 0 | 1100 | 6.02 | Not measurable | Not polarized |
| 7 | — | 0 | 0.1 | 0.5 | 1100 | 6.82 | 37.1 | 13.5 |
| 8 | — | 0 | 0.3 | 0.5 | 1100 | 6.93 | 37.5 | 13.6 |
| 9 | — | 0 | 0.5 | 0.5 | 1100 | 6.91 | 37.6 | 14.1 |
| 10* | — | 0 | 0.6 | 0.5 | 1100 | 6.50 | 43.5 | 8.5 |
| 11 | — | 0 | 0.1 | 1.0 | 1100 | 7.01 | 35.8 | 13.6 |
| 12 | — | 0 | 0.5 | 1.0 | 1100 | 7.02 | 35.6 | 14.2 |
| 13 | — | 0 | 0.1 | 1.5 | 1100 | 6.99 | 34.9 | 14.2 |
| 14 | — | 0 | 0.3 | 1.5 | 1100 | 7.01 | 34.3 | 14.6 |
| 15 | — | 0 | 0.5 | 1.5 | 1100 | 7.02 | 34.8 | 14.9 |
| 16* | — | 0 | 0.6 | 1.6 | 1100 | 6.46 | 43.0 | 9.1 |
| 17 | — | 0 | 0.1 | 1.6 | 1100 | 6.40 | 42.5 | 11.8 |
| 18 | — | 0 | 0.3 | 1.6 | 1100 | 6.52 | 42.0 | 10.1 |
| 19 | — | 0 | 0.5 | 0.5 | 1100 | 6.29 | 41.5 | 10.1 |
| 20 | Mg | 0.05 | 0 | 0.5 | 1100 | 6.32 | 45.8 | 7.5 |
| 21* | Mg | 0.1 | 0 | 0.5 | 1100 | 6.17 | 45.1 | 7.9 |
| 22* | Mg | 0.3 | 0 | 0.5 | 1100 | 6.40 | 50.2 | 8.1 |
| 23* | Mg | 0.5 | 0 | 0.5 | 1100 | 6.58 | 43.5 | 9.4 |
| 24* | Mg | 0.6 | 0 | 0.5 | 1100 | 6.63 | Not measurable | Not polarized |
| 25 | Mg | 0.05 | 0.1 | 0.5 | 1100 | 6.99 | 37.5 | 15.8 |
| 26 | Mg | 0.1 | 0.1 | 0.5 | 1100 | 5.96 | 38.0 | 16.5 |
| 27 | Mg | 0.3 | 0.1 | 0.5 | 1100 | 6.97 | 38.3 | 15.1 |
| 28 | Mg | 0.5 | 0.1 | 0.5 | 1100 | 6.92 | 38.9 | 14.6 |
| 29 | Mg | 0.6 | 0.1 | 0.5 | 1100 | 6.23 | 42.1 | 10.5 |
| 30 | Mg | 0.05 | 0.3 | 0.5 | 1100 | 7.01 | 38.1 | 16.3 |

TABLE 2

| Sample No. | M | x | y | z | Firing temperature (° C.) | Density (g/cm²) | frTC (ppm/° C.) | kt (%) |
|---|---|---|---|---|---|---|---|---|
| 31 | Mg | 0.1 | 0.3 | 0.5 | 1100 | 6.90 | 38.6 | 16.7 |
| 32 | Mg | 0.3 | 0.3 | 0.5 | 1100 | 6.88 | 38.5 | 15.1 |
| 33 | Mg | 0.5 | 0.3 | 0.5 | 1100 | 6.92 | 39.0 | 14.8 |
| 34 | Mg | 0.05 | 0.5 | 0.5 | 1100 | 6.93 | 39.2 | 15.2 |
| 35 | Mg | 0.1 | 0.5 | 0.5 | 1100 | 7.01 | 39.1 | 17.0 |
| 36 | Mg | 0.3 | 0.5 | 0.5 | 1100 | 7.00 | 39.5 | 16.2 |
| 37* | Mg | 0.5 | 0.5 | 0.5 | 1100 | 6.99 | 39.8 | 15.7 |
| 38* | Mg | 0.05 | 0.6 | 0.5 | 1100 | 6.10 | 42.3 | 7.8 |
| 39* | Mg | 0.1 | 0.6 | 0.5 | 1100 | 6.11 | 41.9 | 9.3 |
| 40* | Mg | 0.3 | 0.6 | 0.5 | 1100 | 6.35 | Not measurable | Not polarized |
| 41* | Mg | 0.5 | 0.6 | 0.5 | 1100 | 6.09 | Not measurable | Not polarized |
| 42 | Mg | 0.1 | 0.1 | 1.0 | 1100 | 6.99 | 37.5 | 14.7 |
| 43 | Mg | 0.3 | 0.1 | 1.0 | 1100 | 7.00 | 37.1 | 14.9 |
| 44 | Sr | 0.3 | 0.1 | 0.5 | 1100 | 7.02 | 38.3 | 15.8 |
| 45 | Sr | 0.5 | 0.1 | 0.5 | 1100 | 6.93 | 37.6 | 15.6 |
| 46 | Sr | 0.3 | 0.5 | 0.5 | 1100 | 6.95 | 37.4 | 18.1 |
| 47 | Sr | 0.5 | 0.5 | 0.5 | 1100 | 6.99 | 37.3 | 19.1 |
| 48* | Sr | 0.3 | 0.6 | 0.5 | 1100 | 6.55 | 45.1 | 9.1 |
| 49* | Sr | 0.5 | 0.6 | 0.5 | 1100 | 6.43 | 42.0 | 9.3 |
| 50 | Ba | 0.3 | 0.1 | 0.5 | 1100 | 6.95 | 38.0 | 14.4 |
| 51 | Ba | 0.5 | 0.1 | 0.5 | 1100 | 6.94 | 37.3 | 14.8 |
| 52 | Ba | 0.3 | 0.5 | 0.5 | 1100 | 6.97 | 37.0 | 15.9 |
| 53 | Ba | 0.5 | 0.5 | 0.5 | 1100 | 6.94 | 36.0 | 16.1 |
| 54* | Ba | 0.3 | 0.6 | 0.5 | 1100 | 6.23 | 41.6 | 7.9 |
| 55* | Ba | 0.5 | 0.6 | 0.5 | 1100 | 6.30 | Not measurable | Not polarized |
| 56* | La | 0.1 | 0 | 0.5 | 1100 | 6.30 | 43.5 | 8.1 |
| 57* | La | 0.2 | 0 | 0.5 | 1100 | 6.35 | 41.5 | 7.8 |
| 58 | La | 0.1 | 0.1 | 0.5 | 1100 | 6.99 | 29.5 | 18.7 |
| 59 | La | 0.2 | 0.1 | 0.5 | 1100 | 7.01 | 30.1 | 19.2 |
| 60 | La | 0.3 | 0.1 | 0.5 | 1100 | 7.02 | 32.5 | 19.1 |

TABLE 3

| Sample No. | M | x | y | z | Firing temperature (° C.) | Density (g/cm³) | frTC (ppm/° C.) | kt (%) |
|---|---|---|---|---|---|---|---|---|
| 61 | La | 0.4 | 0.1 | 0.5 | 1100 | 6.09 | 33.3 | 10.8 |
| 62 | La | 0.1 | 0.5 | 0.5 | 1100 | 6.88 | 30.1 | 17.8 |
| 63 | La | 0.2 | 0.5 | 0.5 | 1100 | 6.89 | 29.5 | 18.6 |
| 64 | La | 0.3 | 0.5 | 0.5 | 1100 | 6.95 | 30.9 | 16.9 |
| 65* | La | 0.1 | 0.6 | 0.5 | 1100 | 6.39 | 42.9 | 7.9 |
| 66* | La | 0.3 | 0.6 | 0.5 | 1100 | 6.25 | Not measurable | Not polarized |
| 67* | La | 0.4 | 0.6 | 0.5 | 1100 | 6.29 | Not measurable | Not polarized |
| 68 | La | 0.1 | 0.1 | 1.0 | 1100 | 7.01 | 28.5 | 16.7 |
| 69 | La | 0.3 | 0.1 | 1.0 | 1100 | 7.00 | 28.9 | 19.6 |
| 70 | Nd | 0.1 | 0.1 | 0.5 | 1100 | 6.99 | 25.9 | 20.1 |
| 71 | Nd | 0.3 | 0.1 | 0.5 | 1100 | 6.94 | 26.4 | 20.0 |
| 72 | Nd | 0.1 | 0.5 | 0.5 | 1100 | 6.95 | 26.0 | 19.8 |
| 73 | Nd | 0.3 | 0.5 | 0.5 | 1100 | 6.92 | 25.1 | 19.4 |
| 74* | Nd | 0.1 | 0.6 | 0.5 | 1100 | 6.41 | 41.3 | 8.5 |
| 75* | Nd | 0.3 | 0.6 | 0.5 | 1100 | 6.09 | 42.0 | 8.6 |
| 76 | Sm | 0.1 | 0.1 | .05 | 1100 | 6.88 | 29.4 | 18.6 |
| 77 | Sm | 0.3 | 0.1 | .05 | 1100 | 6.92 | 28.9 | 18.3 |
| 78 | Sm | 0.1 | 0.5 | .05 | 1100 | 6.94 | 29.0 | 19.3 |
| 79 | Sm | 0.3 | 0.5 | .05 | 1100 | 6.99 | 28.4 | 18.0 |
| 80* | Sm | 0.1 | 0.6 | .05 | 1100 | 6.11 | 43.0 | 9.1 |
| 81* | Sm | 0.3 | 0.6 | .05 | 1100 | 6.32 | 42.2 | 7.8 |
| 82 | Y | 0.1 | 0.1 | 0.5 | 1100 | 6.95 | 25.4 | 19.9 |
| 83 | Y | 0.3 | 0.1 | 0.5 | 1100 | 6.91 | 25.3 | 20.5 |
| 84 | Y | 0.1 | 0.5 | 0.5 | 1100 | 7.00 | 24.9 | 18.8 |
| 85 | Y | 0.3 | 0.5 | 0.5 | 1100 | 6.80 | 24.8 | 19.3 |
| 86* | Y | 0.1 | 0.6 | 0.5 | 1100 | 6.05 | 45.0 | 8.4 |
| 87* | Y | 0.3 | 0.6 | 0.5 | 1100 | 6.07 | Not measurable | Not polarized |

In Tables 1 to 3, values x/4 and y in the compositional formula refer to M content (mol) and W content (mol) per mol of Bi, respectively.

As is clear from Tables 1 to 3, samples in which y=0 cannot be sufficiently sintered at a firing temperature lower than 1100° C. and cannot be polarized, whereas samples in which y>0.1 do not exhibit an mechanical coupling coefficient (kt) sufficient for practical use. Therefore, the range of y in the compositional formula is determined as $0 < y \leq 0.5$.

In the present invention, when M is at least one divalent metal element of Mg, Sr and Ba, x/4 must satisfy $0 \leq x/4 \leq 0.125$. When x/4 is greater than upper limit, electromechanical coupling coefficient (kt) is low as compared with the case in which no M is contained, and thus the effect of M cannot be obtained.

In the present invention, when M is at least one trivalent metal element of La, Nd, Sm and Y, x/4 must satisfy $0 \leq x/4 \leq 0.075$. When x/4 is greater than about 0.075, electromechanical coupling coefficient (kt) is low as compared with the case in which no M is contained, and thus the effect of M cannot be obtained.

The amount of Mn as $MnCO_3$ is about 1.5 wt. % or less in the present invention. When the amount is greater than about 1.5 wt. %, the electromechanical coupling coefficient decreases and the temperature coefficient of resonance frequency (frTC) increases as compared with the case in which no Mn is contained.

As is clear from Tables 1 to 3, the samples according to the present invention, produced by firing at 1100° C., exhibit an electromechanical coupling coefficient (kt) sufficient for practical use.

In addition, when M is at least one of La, Nd, Sm and Y, the samples according to the present invention, produced by firing at 1100° C., exhibit an electromechanical coupling coefficient (kt) sufficient for practical use, and a low temperature coefficient of resonance frequency (frTC). This indicates that the composition of the present invention is useful for producing a piezoelectric ceramic material having such properties.

When M is at least one of Nd and Y, the piezoelectric compositions according to the present invention exhibit a particularly small temperature coefficient of resonance frequency (frTC).

The above-described samples having a variety of compositional proportions should not be construed as limiting the invention thereto. Any piezoelectric ceramic composition will exhibit the effects of the present invention so long as it does not deviate from the gist of the present invention.

The present invention requires that the piezoelectric ceramic composition predominantly comprising $CaBi_4Ti_4O_{15}$ essentially satisfy the aforementioned compositional conditions. Thus, there may be a small variation from stoichiometry of constitutional elements.

Figure 2:
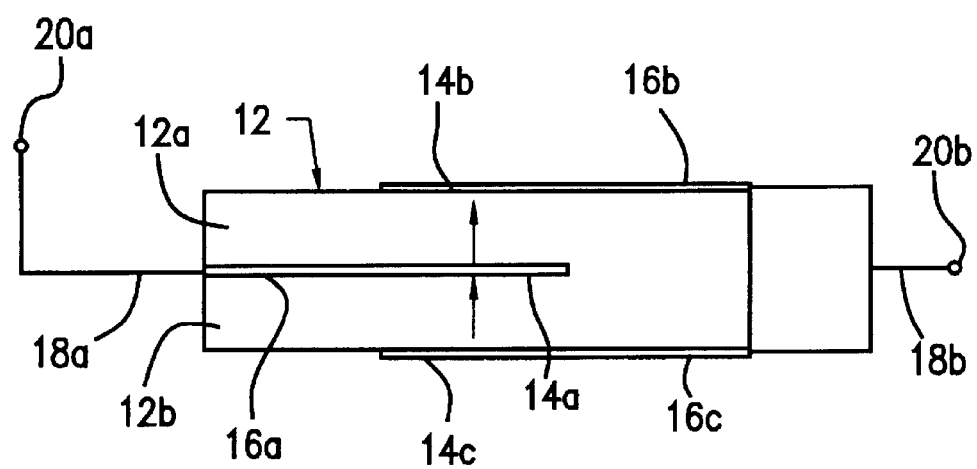
FIG. 2 is a partial cross-sectional view of the ceramic piezoelectric transducer as shown in FIG. 1.

A ceramic piezoelectric device in accordance with the present invention will next be described. FIG. 1 is a perspective view of one example of the ceramic piezoelectric transducer according to the present invention and FIG. 2 is a partial cross-sectional view of the transducer. The piezoelectric transducer 10 shown in FIGS. 1 and 2 includes a piezoelectric ceramic material 12 (e.g., rectangular parallelepiped form). The piezoelectric ceramic body 12 comprises two piezoelectric ceramic layers, 12a and 12b, which are formed of the piezoelectric ceramic composition of the present invention. The layers 12a and 12b are placed one on the other and monolithically shaped. As shown in FIG. 2, the layers 12a and 12b are polarized in the same thickness direction indicated with arrows.

A vibration electrode 14a (e.g., a circular shape) is disposed in a central portion between the piezoelectric ceramic layers 12a and 12b. A lead electrode 16a (e.g., T shape) extends from the vibration electrode 14a to a first side face of the piezoelectric ceramic body 12. On the outer surface of the piezoelectric ceramic layer 12a, a vibration electrode 14b (e.g., a circular shape) is disposed. A lead electrode 16b (e.g., T shape) extends from the vibration electrode 14b to a second side face of the piezoelectric ceramic body 12. In addition, on the outer surface of the piezoelectric ceramic layer 12b, a vibration electrode 14c (e.g., a circular shape) is disposed. A lead electrode 16c (e.g., T shape) extends from the vibration electrode 14c to the second side face of the piezoelectric ceramic body 12.

The lead electrode 16a is connected to an external electrode 20a via a lead 18a, while lead electrodes 16b and 16c are connected to an external electrode 20b via a branched lead 18b.

Other than the aforementioned ceramic piezoelectric transducer 10, the present invention encompasses ceramic piezoelectric devices such as other ceramic piezoelectric transducers, ceramic piezoelectric filters, and ceramic piezoelectric oscillators.

As described hereinabove, the present invention provides a piezoelectric ceramic composition predominantly comprising $CaBi_4Ti_4O_{15}$, which composition can be fired at 1100° C. or lower, which exhibits an electromechanical coupling coefficient (kt) of a sufficient level for practical use, and which serves as a useful material for producing ceramic piezoelectric devices such as piezoelectric filters, piezoelectric oscillators, and piezoelectric transducers.

What is claimed is:

1. A piezoelectric ceramic composition comprising a component represented by the formula $CaBi_4Ti_4O_{15}$ wherein the composition also comprises W in an amount of about 0.5 mol or less (but greater than 0) per mol of Bi contained in the component.

2. A piezoelectric ceramic composition according to claim 1, having a component represented by the formula $$(Ca_{1-x}M_x)Bi_4(Ti_{1-y}W_y)_4O_{15} + z \text{ wt. \% } MnCO_3$$

wherein $0 < y \leqq 0.5$, M is a divalent metal other than Cu and $0 < x \leqq 0.5$ or a trivalent metal other than Bi and $0 < x \leqq 0.3$, and $0 \leqq z \leqq 1.5$.

3. A piezoelectric ceramic composition according to claim 2, wherein z is greater than 0.

4. A piezoelectric ceramic composition according to claim 2, wherein z is 0.

5. A piezoelectric ceramic composition according to claim 2, wherein x is 0 and the component is represented by $CaBi_4(Ti_{1-y}W_y)_4O_{15} + z$ wt. $\%MnCO_3$.

6. A piezoelectric ceramic composition according to claim 5, wherein z is greater than 0.

7. A piezoelectric ceramic composition according to claim 2, wherein x is greater than 0 and M is a divalent metal element other than Ca.

8. A piezoelectric ceramic composition according to claim 7, wherein the divalent metal element other than Ca is at least one member selected from among Mg, Sr and Ba.

9. A piezoelectric ceramic composition according to claim 7, wherein z is greater than 0.

10. A piezoelectric ceramic composition according to claim 2, wherein x is greater than 0 and M is a trivalent metal element other than Bi.

11. A piezoelectric ceramic composition according to claim 10, wherein the trivalent metal element other than Bi is at least one member selected from among La, Ce, Pr, Nd, Sm, Gd, Dy, Er, Yb, Sc and Y.

12. A piezoelectric ceramic composition according to claim 10, wherein z is greater than 0.

13. A polarized piezoelectric ceramic material comprising a piezoelectric ceramic composition as recited in claim 1.

14. A ceramic piezoelectric device comprising a piezoelectric ceramic material as recited in claim 13 and an electrode attached to the ceramic material.

15. A polarized piezoelectric ceramic material comprising a piezoelectric ceramic composition as recited in claim 2.

16. A ceramic piezoelectric device comprising a piezoelectric ceramic material as recited in claim 15 and an electrode attached to the ceramic material.

17. A polarized piezoelectric ceramic material comprising a piezoelectric ceramic composition as recited in claim 3.

18. A ceramic piezoelectric device comprising a piezoelectric ceramic material as recited in claim 17 and an electrode attached to the ceramic material.

19. A polarized piezoelectric ceramic material comprising a piezoelectric ceramic composition as recited in claim 4.

20. A ceramic piezoelectric device comprising a piezoelectric ceramic material as recited in claim 19 and an electrode attached to the ceramic material.

* * * * *